United States Patent [19]

Kim et al.

[11] Patent Number: 5,299,162
[45] Date of Patent: Mar. 29, 1994

[54] NONVOLATILE SEMICONDUCTOR MEMORY DEVICE AND AN OPTIMIZING PROGRAMMING METHOD THEREOF

[75] Inventors: Jin-ki Kim, Seoul; Kang-deog Suh, Anyang, both of Rep. of Korea

[73] Assignee: Samsung Electronics Co., Ltd., Kyunggi, Rep. of Korea

[21] Appl. No.: 876,460

[22] Filed: Apr. 30, 1992

[30] Foreign Application Priority Data

Feb. 21, 1992 [KR] Rep. of Korea .................. 92-2689

[51] Int. Cl.$^5$ ................................................. G11C 7/00
[52] U.S. Cl. ............................... 365/201; 365/189.01; 365/189.11; 365/185
[58] Field of Search .............. 365/201, 189.01, 189.11, 365/230.03, 230.08, 200; 369/185

[56] References Cited

U.S. PATENT DOCUMENTS

| | | | |
|---|---|---|---|
| 4,887,242 | 12/1989 | Hashimoto | 365/230.08 |
| 4,996,669 | 2/1991 | Endoh et al. | 365/189.01 |
| 5,075,890 | 12/1991 | Itoh et al. | 365/189.11 |
| 5,105,384 | 4/1992 | Noguchi et al. | 365/230.08 |

*Primary Examiner*—Eugene R. LaRoche
*Assistant Examiner*—Tan Nguyen

*Attorney, Agent, or Firm*—Rothwell, Figg, Ernst & Kurz

[57] ABSTRACT

A nonvolatile semiconductor memory device particularly relates to an EEPROM having NAND-structured cells, and an optimizing programming method thereof. The device includes a memory cell array arranged as matrix having NAND cells formed by a plurality of serially-connected memory cells each of which is formed by stacking a charge storage layer and a control gate on a semiconductor substrate, and enables electrical erasing by the mutual exchange of a charge between the charge storage layer and the substrate, a data latch circuit, a high voltage supply circuit, a current source circuit, a program checking circuit, and a program status detecting circuit. The programming state is optimized while being unaffected by the variance of process parameters, over-programming is prevented by the use of a verifying potential, and the performance of the chip is enhanced by automatically optimizing the programming with a chip's internal verification function. External control is not required, which enhances performance of the overall system. Also, a page buffer of an existing flash memory having the page mode function is employed, which is applicable to the currently used products.

6 Claims, 7 Drawing Sheets

| | Program '0' | | Program '1' | | φ1 | φ2 | φ3 | $\overline{φ4}$ | φ5 |
|---|---|---|---|---|---|---|---|---|---|
| | BL | DATA | BL | DATA | | | | | |
| Data Loading | Vcc | DATA | DATA | Vcc | Vcc | GND | Vcc | Vcc | GND |
| Program | Vppb(1) | Vcc | GND | Vcc | Vcc | GND | Vcc | Vcc | GND |
| Program Verification | Vcc | GND | GND | Vcc | GND | Vcc | GND | GND | GND |
| Re-program | Vppb | Vcc | GND | Vcc | Vcc | GND | Vcc | Vcc | GND |
| Program Verification | Vcc | GND | Vcc-Vcc | GND | GND | Vcc | GND | GND | Vcc |

NONVOLATILE SEMICONDUCTOR MEMORY DEVICE AND AN OPTIMIZING PROGRAMMING METHOD THEREOF

BACKGROUND OF THE INVENTION

The present invention relates to a nonvolatile semiconductor memory device and an optimizing programming method thereof, and more particularly to a EEPROM having NAND-structured cells and a method capable of optimizing the data programming using the same.

Figure 1:
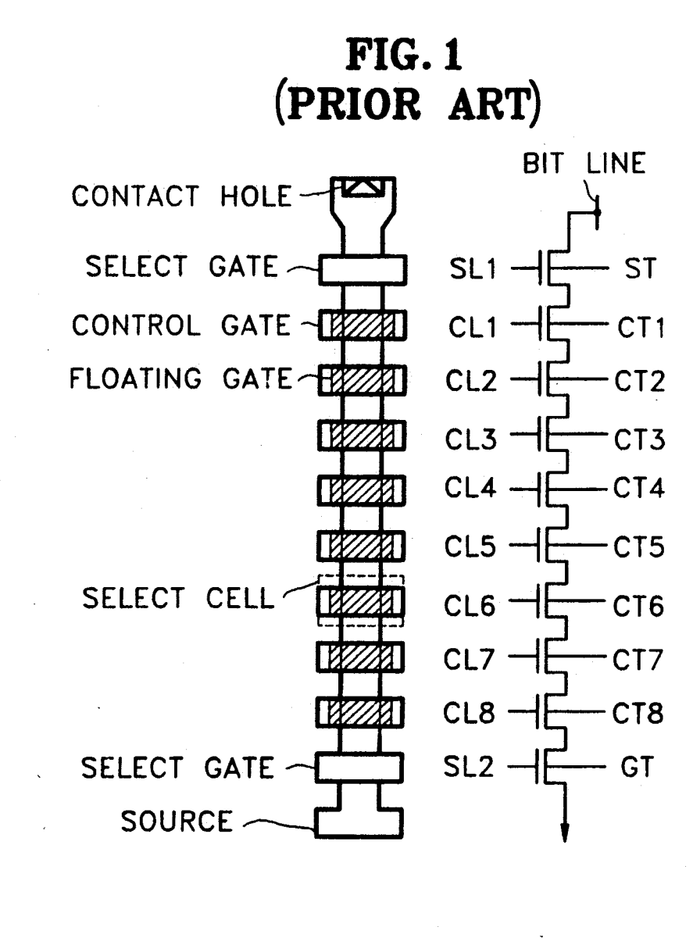
FIG. 1 is a plan view of a NAND-structured cell string of a conventional flash EEPROM of the first generation and its equivalent circuit diagram.
Figure 2:
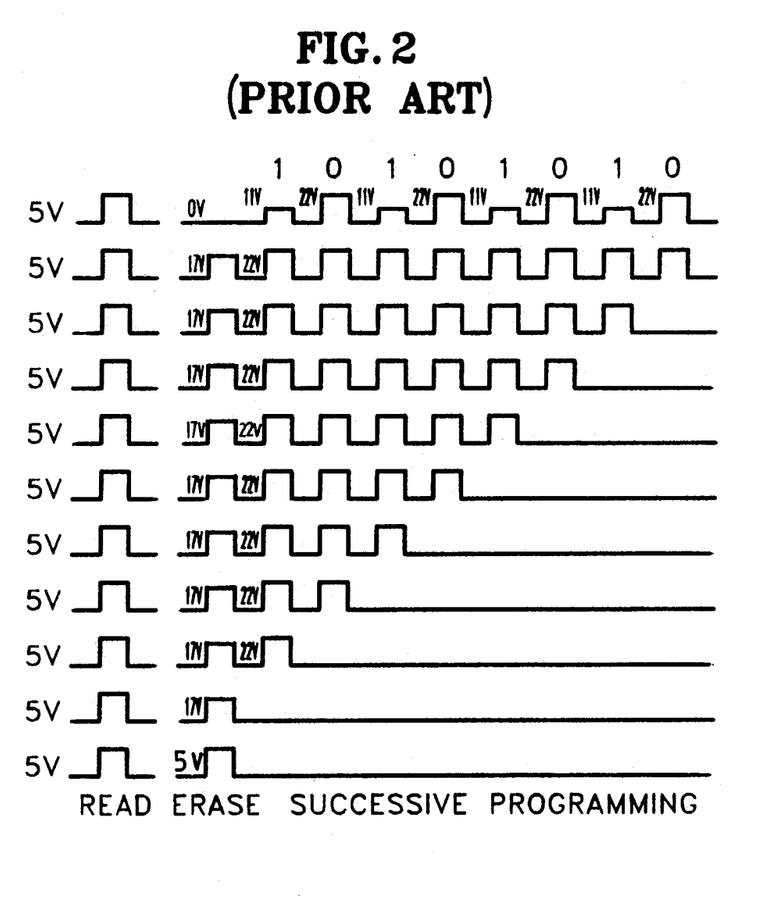
FIG. 2 shows voltage waveforms supplied during reading-out, erasing, and programming operations of the NAND-structured cell string of the first generation.

FIG. 1 is a plan view showing a conventional NAND-structured cell string of the first generation, and an equivalent circuit thereof. FIG. 2 shows control voltage conditions during a read operation and the timing of the control voltage during erasing and programming operations of a flash memory having the NAND structured cell string of the first generation.

The operating condition of a selected cell while erasing and programming in the conventional flash memory of first generation is as follows. First, while erasing, by supplying an erase voltage (17 V) to the gate CL6 of a selected cell CL6, and 0 V to the drain of the cell, electrons are injected from the drain to a floating gate by F-N (Fowler-Nordheim) tunneling, so that the cell's threshold voltage becomes positive.

While programming, by supplying 0 V to the gate of selected cell CL6 and a program voltage (22 V) to its drain, electrons are emitted from the floating gate to the drain of the cell by F-N tunneling, so that the threshold voltage of the cell becomes negative (refer to IEEE Journal of Solid-State Circuits, Oct. 1989, pp. 1238–1243). Therefore, while erasing and programming, stress is continuously imposed on the thin gate oxide layer for tunneling at the drain-side of the cell, which affects endurance (the number of write cycles) and data retention (the charge retention characteristic of a floating gate) of the cell. In particular, if the cell size is increasingly scaled down by achieving higher densities and larger capacitances, the above-described reliable characteristic of the cell is further degraded.

Figure 3:
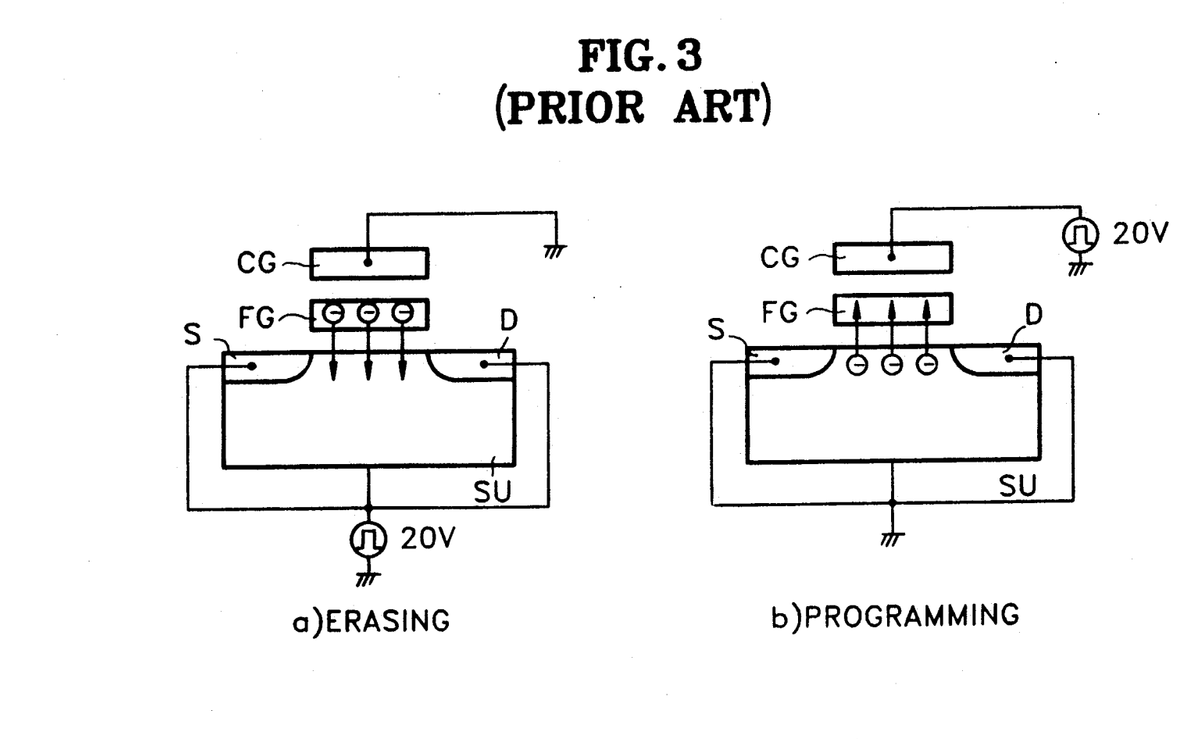
FIGS. 3A and 3B are schematic views for illustrating the erasing and programming operations of a flash EEPROM of second generation.

FIGS. 3A and 3B are schematic sectional views of a cell for illustrating the erasing and programming operations of a flash memory having a conventional NAND-structured cell of the second generation.

In the flash memory of the second generation, while erasing (FIG. 3A), 0 V is supplied to a gate CG of a selected cell, and an erase voltage (20 V) is supplied to a substrate SU, a source S, and a drain D, so that electrons are emitted from a floating gate FG of the cell to substrate SU, which makes the threshold voltage of the cell negative. While programming (FIG. 3B), a program voltage (20 V) is applied to gate CG of the selected cell, and 0 V is supplied to substrate SU, source S and drain D, so that electrons are injected from substrate SU to floating gate FG of the cell, which makes the threshold voltage of the cell positive. That is, the operational condition is contrary to that of the flash memory of the first generation, and the injection and emission of electrons are not limited to the cell's drain, but occur throughout its floating gate, substrate, source as well as the drain. Therefore, leakage current through the thin gate oxide layer for tunneling which is caused by stress during erasing and programming can be decreased, thereby greatly enhancing reliability of the cell. In addition to this, the threshold voltage of the cell is negative during erasing, and the problem of over-erasing is solved (refer to Symposium on VLSI Technology/1990, pp. 129 and 130).

Figure 4A:
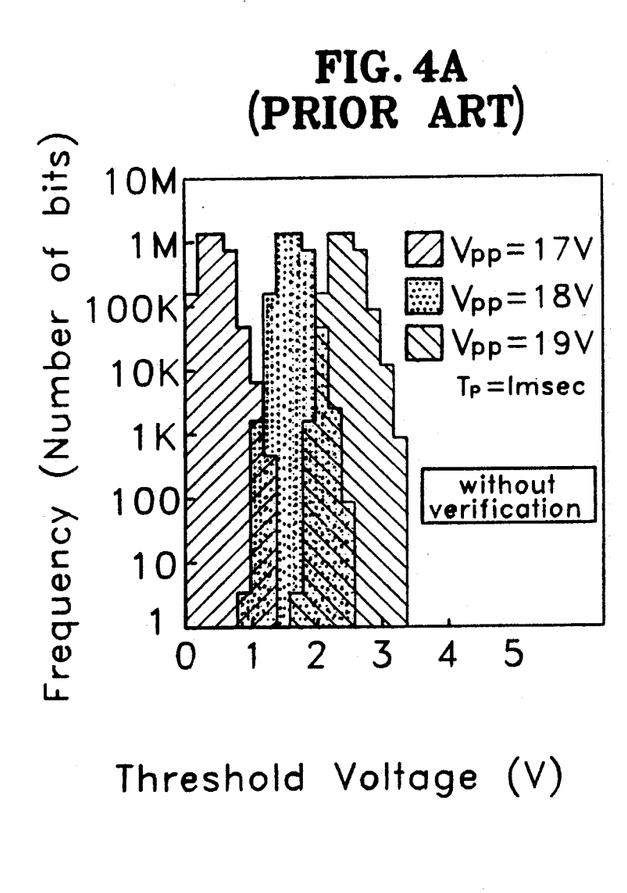
FIGS. 4A and 4B are graph representations showing the threshold voltage distribution characteristic of a programmed cell with respect to the program voltage variance of the flash EEPROM of the second generation with and without verification, respectively.

However, as shown in FIG. 4A, since the threshold voltage distribution characteristic of the programmed cell degrades due to high voltage variations caused by the variation of process parameters during the cell programming in the flash memory of the second generation, an over-programming phenomenon occurs. In other words, even if only one cell is over-programmed within a cell string of a NAND-structured flash memory, the entire cell string is not read out. Accordingly, some means for preventing over-programming is required to maintain the optimized programming condition.

Figure 4B:
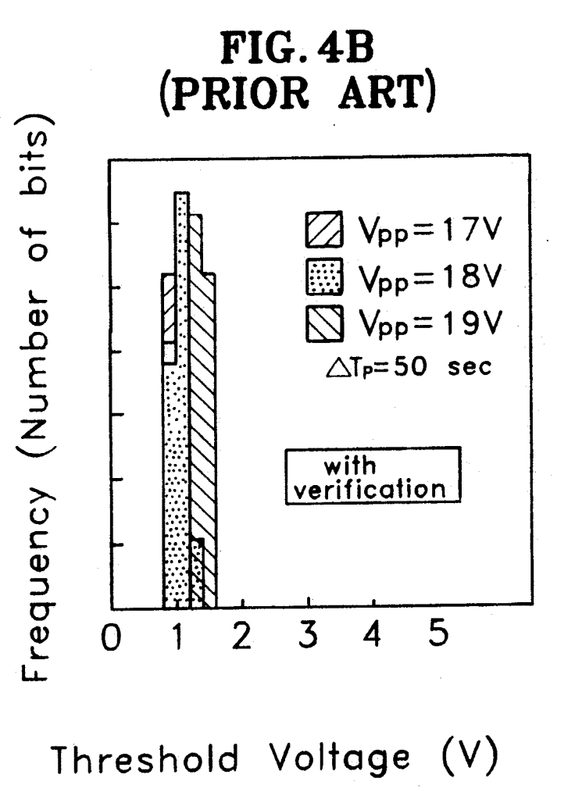

When the programming is repeated via program verification as shown in FIG. 4B, it can be noted that the threshold voltage of a cell is evenly distributed.

Figure 5:
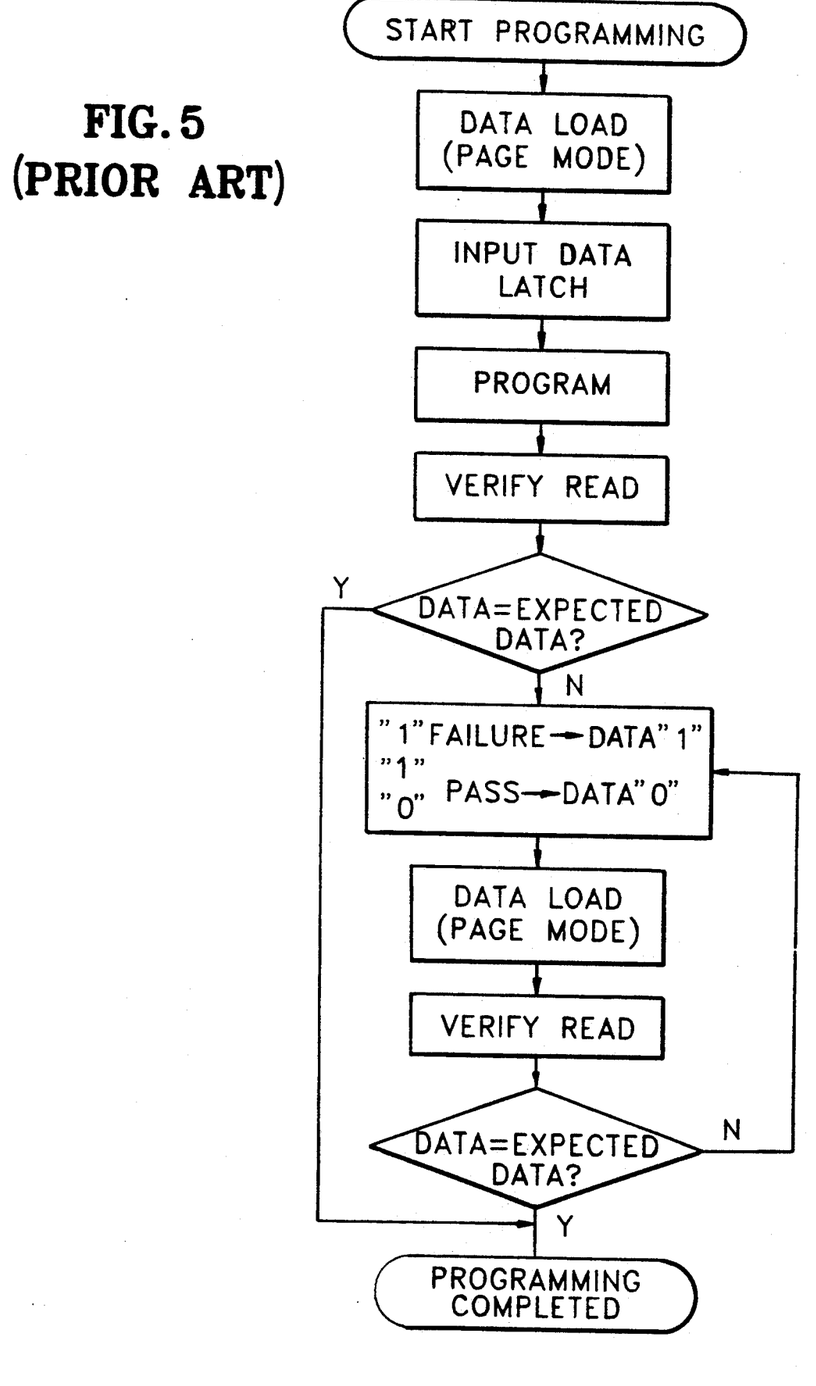
FIG. 5 is a flowchart showing the program verification algorithm of the flash EEPROM of the second generation.
Figure 6:
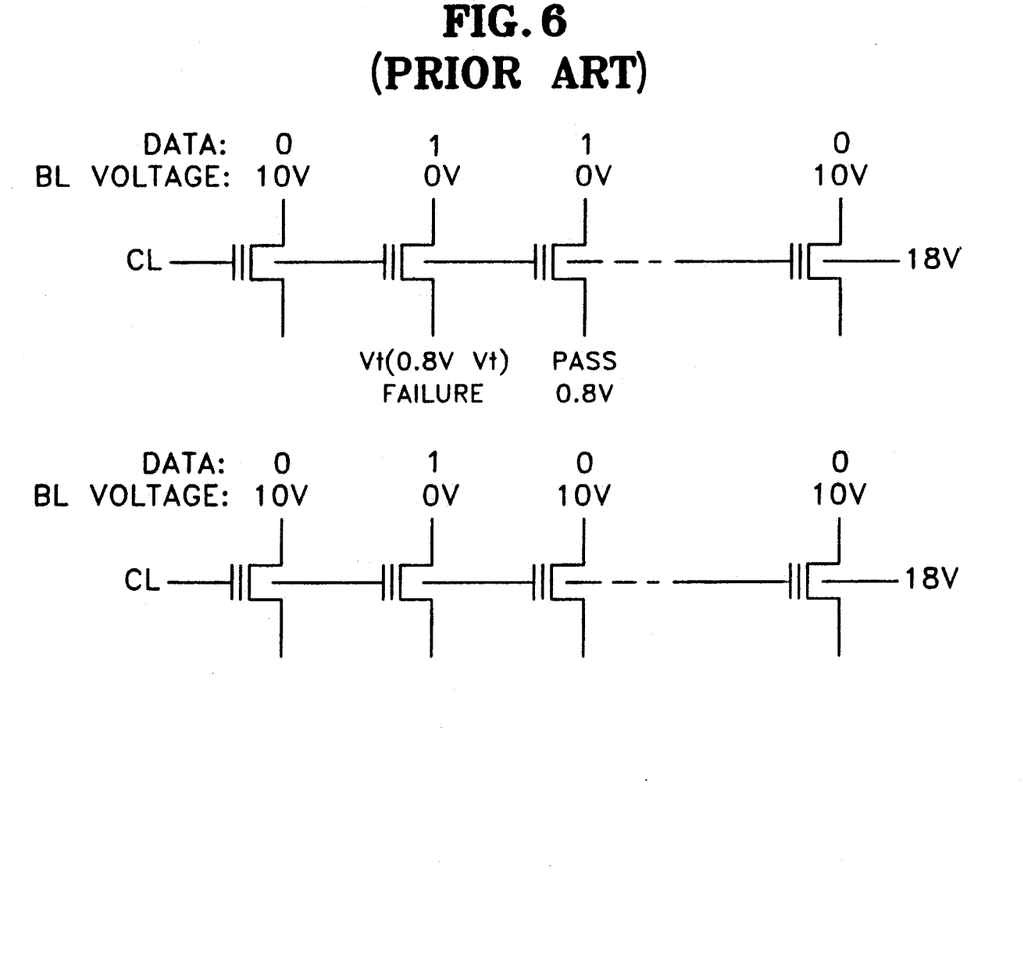
FIG. 6 is a view for illustrating the programmed state in accordance with the program verification algorithm of FIG. 5.

Thus, conventionally, programmed data states of a flash EEPROM are verified and the re-programming of data is carried out by an external verifying controller which performs the algorithm shown in FIG. 5, in order to optimize data programming. The data program verification algorithm loads data in a page mode and latches input data. Then, after programming the latched data into each cell of a selected cell line, data is read out to verify the programmed state of the data. When the read-out data is the same as an expected value, programming is completed. Meanwhile, when the read-out data differs from the expected value, as shown in FIG. 6, data bits corresponding to a cell which has failed in the programming of a "1" are maintained at "1," and data bits corresponding to a cell into which a data bit "1" or "0" is normally programmed are set to zero. The data processed as described above is repeatedly adjusted in the page mode, and the adjusted data is re-programmed into each cell of the selected cell-line. After repeating the programming, the data is read out to check the programmed state of each cell, so that the programming operation is finished when the programming is in the normal state. Otherwise, the cycling process of reading out data and programming the corrected data is repeated as described above when the programming is in an abnormal state (refer to IEEE Journal of Solid-State Circuits, April 1991, pp. 492–496).

However, according to the foregoing conventional verification algorithm, the process wherein data programmed by an external controller is read out and checked, and then loaded again for re-programming should be repeatedly carried out until the normal programmed state of every cell is detected, which degrades the performance of the overall system.

SUMMARY OF THE INVENTION

The present invention is devised to solve the above-described conventional problems. Accordingly, it is an object of the present invention to provide a nonvolatile semiconductor memory device which can automatically optimize data programming by one-time automatic data loading.

It is another object of the present invention to provide a nonvolatile semiconductor memory device which can prevent a data over-programming phenomenon.

It is still another object of the present invention to provide an optimum programming method of a nonvolatile semiconductor memory device, which can automatically optimize data programming within a chip.

To achieve these and other objects of the present invention, there is provided a nonvolatile semiconductor memory device comprising:

a memory cell array arranged as a matrix having NAND cells formed by a plurality of serially-connected memory cells each of which is formed by stacking a charge storage layer and a control gate on a semiconductor substrate, and capable of electrical erasing by the mutual exchange of a charge between the charge storage layer and the substrate;

data latch circuit for endowing program data to bit lines of the memory cell array;

high voltage supply circuit for supplying a predetermined high voltage to the bit lines of the memory cell array in accordance with the status of the data of the data latch circuit;

current source circuit for supplying verifying current to the bit lines of the memory cell array in order to confirm the programmed status of data, after programming the data into the memory cell array;

program checking means for inverting the status of data of the data latch circuit in response to whether or not the verifying current supplied to the bit lines flows through the memory cell, when the verifying current is supplied to the control gate of the memory cell which is to be verified in the memory cell array; and program-status detecting circuit for generating program status detecting signal in response to the inverting operation of the data state of the data latch circuit by the program checking circuit.

Also, the present invention provides a method for optimally programming a non-volatile semiconductor memory device which performs a block page mode wherein a plurality of NAND-structured cell strings are erased by blocks, and input data latched to a page buffer are simultaneously programmed in cells of a selected cell row, which method comprises the steps of:

program verifying which supplies a verification control voltage and a verifying current to each cell of the selected cell line, checks the programmed state of the data in each cell, and inverts only the data of the page buffer corresponding to a cell having normally programmed data among the data programmed cells in response to the checking operation;

re-programming which re-programs the data of the page buffer corrected by said program verifying step into each cell of the selected cell line; and automatically repeating the verifying and re-programming steps until corresponding data inversion of the page buffer is completely carried out by normally programming the data into the cell upon which data programming is performed among each cell of the selected cell line, whereby data programming of one page length can be optimized with only a one-time external data input operation and without over-programming.

BRIEF DESCRIPTION OF THE DRAWINGS

The above objects and other advantages of the present invention will become more apparent by describing in detail the preferred embodiment of the present invention with reference to the accompanying drawings in which.

DETAILED DESCRIPTION OF THE INVENTION

Figure 7:
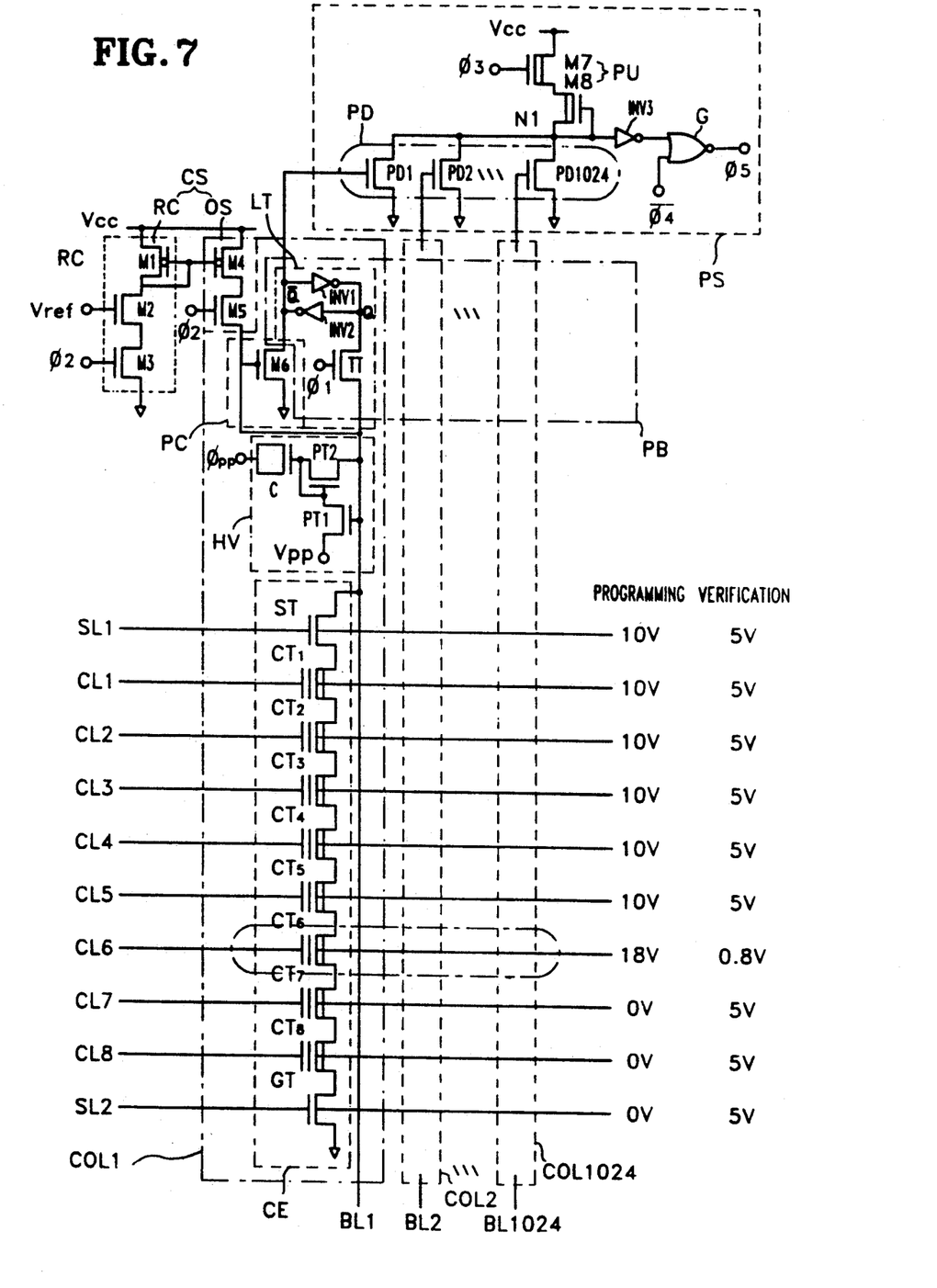
FIG. 7 is a circuit diagram of a cell array and a detecting circuit in a flash EEPROM of the second generation according to the present invention.

Referring to FIG. 7 which illustrates the cell array of flash memory having NAND type cell structure as well as the program-status detecting circuit according to the present invention, each bit line BL1-BL1024 is connected to a NAND-structured cell CE of a string unit consisting of a string-select transistor ST, eight cell transistors CT1-CT8, and a ground-select transistor GT, which are serially connected. String-select transistor ST and ground-select transistor GT have a MOS transistor structure, and their gates are respectively connected to select lines SL1 and SL2. Each cell transistor CT1-CT8 has a depletion MOS transistor structure with a floating gate between a control gate and a substrate, and each control gate is respectively connected to control lines CL1-CL8. Also, each bit line BL1-BL1024 is connected to respective high voltage supply circuits HV for supplying a high potential programming voltage to the bit line during data programming, respective bit line latch circuits LT to which externally input data will be loaded, current source circuit CS for supplying verifying current during program verification, and respective program checking units PC for inverting the data of a bit line latch circuit LT in response to insufficient programming during program verification.

High voltage supply circuit HV is a common high voltage pumping circuit which is composed of transistors PT1 and PT2 and a pumping capacitor C. The drain of transistor PT1 is connected to a programming supply voltage Vpp, its gate is connected to bit line BL1, and its source is connected to the gate of transistor PT2. The drain of transistor PT2 is tied to its gate and one terminal of pumping capacitor C, and its source is also connected to bit line BL1. Pumping capacitor C discharges charge stored therein through transistor PT2 to bit line BL1 when a clock signal $\phi pp$ coupled to the other terminal of pumping capacitor C goes high, thereby supplying an erase voltage (10 V) or a program inhibit voltage (10 V) to bit line BL1.

Bit line latch circuit LT consists of two inverters INV1 and INV2, and a transfer transistor TT1. Inverters INV1 and INV2 are connected such that the input of one inverter is connected to the output of the other inverter. The gate of transfer transistor TT1 is coupled to the source of a clock signal $\phi1$, a first current terminal thereof (drain or source) is connected to the bit line, and a second current terminal thereof (source or drain) is connected to the input of inverter INV2. Accordingly, bit line latch circuit LT inputs and latches external data imposed on the bit line via transfer transistor TT1 which is turned on during a high potential of clock signal $\phi1$.

Current source circuit CS is formed of a plurality of output circuits OS connected to respective bit lines and a common reference-current setting circuit RC, which are coupled to each other in the form of a well-known current mirror circuit so as to set a reference current for all output circuits OS. Common reference-current setting unit RC is composed of a p-channel MOS transistor M1 and n-channel MOS transistors M2 and M3 serially connected between a first supply voltage Vcc and a second supply voltage Vss (ground). The drain and gate of p-channel MOS transistor M1 are commonly connected with each other. The gate of n-channel MOS transistor M2 is coupled to the source of a reference voltage Vref, the gate of n-channel MOS transistor M3 is coupled to the source of a clock signal $\phi2$. Each output circuit OS is composed of a p-channel MOS transistor M4 and an n-channel MOS transistor M5 serially connected between first supply voltage Vcc and respective bit lines. The gate of p-channel MOS transistor M4 is connected to the gate of p-channel MOS transistor M1, and the gate of n-channel MOS transistor M5 is also coupled to the source of clock signal $\phi2$. Therefore, current source circuit CS is enabled when clock signal $\phi2$ goes high, so that the drain current of p-channel MOS transistor M4 is supplied to bit line BL1 as a verifying current which is in proportion to the drain current of p-channel MOS transistor M1 multiplied by the aspect ratio of MOS transistors M1 and M4.

Program checking unit PC is formed of a MOS transistor M6 whose drain is connected to the input of inverter INV1 of bit line latch circuit LT, its source is connected to a second supply voltage (Vss or ground), and its gate is connected to the bit line. Thus, when the verifying current supplied to the bit line does not flow to ground through the NAND-structured cell string having the verifying current applied to a selected cell, the potential of the bit line goes high, so that MOS transistor M6 (the program checking unit) is turned on, which in turn lowers the input of inverter INV1 of latch circuit LT to a low potential (ground). Therefore, when the programming of the selected cell is insufficient, program checking unit PC checks the insufficient programming, thereby inverting the data of bit line latch circuit LT.

1024 of the above-described NAND-structured cell string CE form one block, and each block has 8 pages of information, i.e., 8 Kbytes of data. The length of one page is 1024 bits. For example, a 4 Mbit flash memory includes 512 blocks. Such a flash memory can program data in a block page mode. Here, one block of bit line latch circuits LT constitute a page buffer PB.

In FIG. 7, reference symbol PS is a program-status detecting circuit. Program-status detecting circuit PS outputs a normal detection signal when all selected cells are optimally programmed, or an abnormal detection signal even if any one cell is insufficiently programmed. Program-status detecting circuit PS has a p-channel MOS transistor M7 serving as pull-up means PU for pulling up a node N1 and a depletion MOS transistor M8 used as the pull-up load. The source of p-channel MOS transistor M7 is coupled to the source of first supply voltage Vcc, its gate is coupled with a clock signal $\phi3$, and its drain is coupled with the source of depletion MOS transistor M8. The gate and drain of depletion MOS transistor M8 are commonly connected with each other, and also connected to node N1. A plurality of n-channel MOS transistors PD1-PD1024 serving as pull-down means PD are connected in parallel between node N1 and second supply voltage Vss (ground). The gate of each MOS transistor is connected to an inverted output $\overline{Q}$ of respective bit line latch circuits LT. Node N1 is connected via an inverter INV3 to one terminal of a NOR gate G which is an output gate. The other terminal of NOR gate G is coupled to the source of a clock signal $\overline{\phi4}$.

Accordingly, program-status detecting circuit PS generates a high potential clock signal $\phi5$ when all pull-down transistors PD1-PD1024 are turned off in the verification mode. Columns COL2-COL1024 have the same structure as column COL1.

Figure 8:
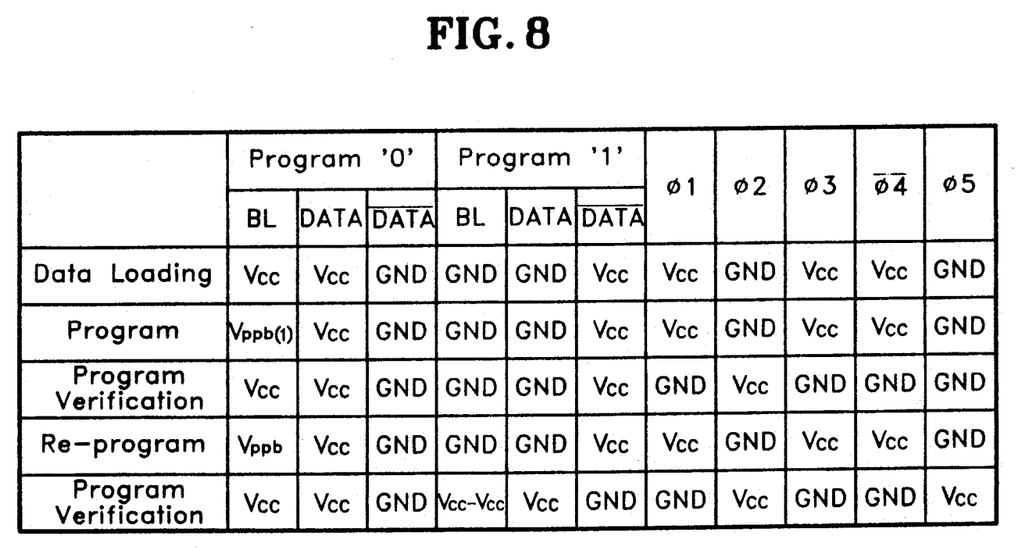
FIG. 8 is a table showing the waveform state of each part in FIG. 7 during the programming of data and verifying of the programmed state.

The program and verification operations of the nonvolatile semiconductor memory device of the present invention shown in FIG. 7 will be described with reference to the table of FIG. 8.

To begin with, in order to program data within a cell array, erasing operation is first performed by blocks. Here, during erasing, when 0 V is applied to the control gate of each cell, and an erase voltage (20 V) is applied to the substrate, source, and drain, electrons are emitted from the floating gate of the cell to the substrate, so that the threshold voltage of the cell becomes negative. When the erasing is completed, external data is input, and the input data is loaded into bit line latch circuit LT. At this time, the loading is performed with a logic high (Vcc level) to load with a data "0" (−Vth), with a logic low (ground level) to load with a data "1" (+Vth). The data is loaded into bit line latch circuit LT when clock signal $\phi1$ goes high. If the data loaded into bit line latch circuit LT is a logic high, high voltage supply circuit HV operates, thereby setting the voltage of bit line BL at 10 V which is the program inhibit voltage. Therefore, as exemplified in FIG. 7, since the potential difference between the gate and drain of a selected cell transistor CT6 is insufficient to excite F-N tunneling, the selected cell transistor CT6 continuously maintains a negative threshold voltage (−Vth).

Meanwhile, if the data loaded into bit line latch circuit LT is a logic low, high voltage supply circuit HV does not operate, thereby maintaining the voltage of bit line BL at 0 V. Thus, since F-N tunneling is excited by the potential difference between the gate and drain of selected cell transistor CT6, electrons are injected to the floating gate, so that the threshold voltage of the cell becomes positive (+Vth). However, if a data bit "1" is insufficiently programmed, selected cell CT6 cannot obtain a predetermined positive threshold voltage. Such a program operation is simultaneously carried out by pages in a page mode. Accordingly, eight programming operations are carried out to program one block (1024×8). To verify the programming upon completing the programming operation, current source circuit CS operates in response to the high states of clock signal $\phi2$, so that a verifying current is supplied to bit line BL. At this time, control lines CL1-CL5, CL7, and CL8 of selective line SL1 and SL2 and unselected cell transistors CT1-CT5, CT7 and CT8 are supplied with Vcc voltage, and control line CL6 of the selected cell row is supplied with a predetermined verify voltage, e.g., +0.8 V. Therefore, when the threshold voltage of selected cell transistor CT6 is negative (data=0), verifying current is shunted to ground through cell string CE. Thus, bit line BL1 maintains its 0 V level.

Meanwhile, when the threshold voltage of the selected cell is positive (i.e., +Vth>0.8 V; data=1), bit line BL1 goes high since the verifying current does not flow through cell string CE. However, if the cell programmed with a data "1" is insufficiently programmed, meaning that the cell's threshold voltage is less than +0.8 V, the verifying current shunts to ground, enabling bit line BL1 to still maintain its 0 V level.

During such a verification operation, when the bit line of the selected cell on which a data "1" is programmed maintains a low potential, transistor M6, which is the program checking means, cannot be turned on, so that data is not inverted in bit line latch circuit LT. Therefore, a data "0" in the initial loading state continues on an output Q. Also, since a data "1" is maintained on inverted output $\overline{Q}$ of bit line latch circuit LT, pull-down transistor PD1 of program-status detecting circuit PS, whose gate is connected to output $\overline{Q}$ continuously maintains turned-on state. Therefore, normal programming is not carried out, so that the clock signal $\phi 5$ of program-status detecting circuit PS maintains a low-potential state.

During re-programming, since a data "0" of bit line latch circuit LT is supplied again to bit line BL1 during a high period of clock signal $\phi 1$, electrons are repeatedly injected to the floating gate of the selected cell which is insufficiently programmed. Thus, the threshold voltage of the cell becomes more positive. If the selected cell is not turned on by the verification voltage (+0.8 V) due to the raising of the threshold voltage of a selected cell to become positive by repeating in sequence, the programming, the verifying, and the re-programming operations, the bit line potential then becomes a logic high, thereby turning on transistor M6. Thus, a data "0" loaded on the output Q of bit line latch circuit LT is inverted to a data "1," and the data "1" of the inverted output is inverted to a data "0," so that pull-down transistor PD1 of program-status detecting circuit PS is turned off. By this repeating operation, when all the data bits of page buffer PB, i.e., inverted outputs $\overline{Q}$, of all the bit line latch circuits are data "0," in other words, when all initially input data "1" are inverted into data "0," clock signal $\phi 5$ of program-status detecting circuit PS becomes a logic high (Vcc level). That is, the cells selected by the input data are programmed.

As described above, the program and verification operations are automatically repeated by the data of the page buffer, with only a one-time data input operation and without external control, until all cells selected by the page buffer, i.e., the bit line latch circuits and a current source circuit, are optimally programmed.

According to the present invention, the programmed state can be optimized while being unaffected by the variance of process parameters, over-programming is prevented by the use of a verifying potential, and optimum programming is automatically carried out by a chip's internal verification function. As a result, the chip's performance can be enhanced, and, in turn, since external control is not required, performance of the overall system using such a chip is enhanced. Further, the present invention is applicable to existing products using a page buffer of a conventional flash memory having the page mode function.

What is claimed is:

1. A non-volatile semiconductor memory device comprising:
   a memory cell array arranged as a matrix having NAND-structured cell formed by a plurality of serially connected memory cells each of which is formed by stacking a charge storage layer and a control gate on a semiconductor substrate, and capable of electrical erasing by the mutual exchange of a charge between said charge storage layer and said substrate;
   data latch means for endowing program data to bit lines of said memory cell array;
   high voltage supply means for supplying a predetermined high voltage to said bit lines of said memory cell array in accordance with the status of the data of said data latch means;
   current source means for supplying verifying current to said bit lines of said memory cell array in order to confirm the programmed status of data, after programming said data into said memory cell array;
   program checking means for inverting the status of data of said data latch means in response to whether or not said verifying current supplied to said bit lines flows through said programmed memory cell when said verifying voltage is supplied to said control gate of said memory cell which is to be verified in said memory cell array; and
   program-status detecting means for generating program status detecting signal in response to the inverting operation of the data state of said data latch means by said program checking means.

2. A non-volatile semiconductor memory device as claimed in claim 1, wherein said current source means comprises:
   a p-channel MOS transistor for a reference current source, whose source is connected to a first supply voltage, and whose drain and gate are commonly connected to each other;
   a load n-channel MOS transistor whose drain is connected to said drain of said p-channel MOS transistor, and whose gate is connected to a reference voltage;
   an n-channel MOS transistor for switching, whose drain is connected to said source of said n-channel MOS transistor, whose gate is coupled with a clock signal which goes high during said verification operation, and whose source is coupled with a second supply voltage;
   a p-channel MOS transistor for an output current source, whose source is connected to said first supply voltage, and whose gate is connected to said gate of said p-channel MOS transistor; and
   an n-channel MOS transistor for an output switch, whose drain is connected to said drain of said p-channel MOS transistor for outputting current source, whose source is connected to a corresponding bit line of said bit lines, and whose gate is coupled with said clock signal.

3. A non-volatile semiconductor memory device as claimed in claim 1, wherein said program-status detecting means comprises:
   pull-up means which is connected between said first supply voltage and a node, and enabled by a control clock signal;

pull-down means which is connected between said node and said second supply voltage, and turned on and off in response to the inverting operation of said data of said data latch means; and output means for buffering the potential of said node, and outputting said buffered node potential as said program status detecting signal in accordance with an output control clock signal.

4. A non-volatile semi-conductor memory device comprising:

a memory cell array arranged as a matrix having NAND cells string formed by a plurality of serially connected memory cells each of which is formed by stacking a charge storage layer and a control gate on a semiconductor substrate, and capable of electrical erasing by the mutual exchange of a charge between said charge storage layer and said substrate;

a page buffer for endowing program data columns having a page length to bit lines of said memory cell array;

high voltage supply means for supplying a predetermined high voltage to said bit lines in accordance with the data status of said page buffer;

current source means for supplying verifying current to said bit lines in order to confirm the programmed state after programming data onto selected cell row of said memory cell array;

program checking means for inverting data corresponding to said page buffer in response to whether or not said verifying current supplied to each bit line flows through each selected cell, when said verify voltage is applied to the control line of said selected cell row; and program-status detecting means for generating a program status detecting signal in response to the status of the data strings of said page buffer which is changed by said program checking means.

5. A method for optimally programming a non-volatile semiconductor memory device which performs a block page mode wherein a plurality of NAND-structured cell strings are erased by blocks, and input data latched to a page buffer are simultaneously programmed in cells of a selected cell row, said method comprising the steps of:

program verifying which supplies a verification control voltage and a verifying current to each cell of said selected cell row, checks the programmed state of the data in each cell, and inverts only the data of said page buffer corresponding to a cell having normally programmed data among said programmed cells in response to said checking operation;

re-programming which re-programs said data of said page buffer corrected by said program verifying step into each cell of said selected cell row; and automatically repeating said verifying and re-programming steps until corresponding data inversion of said page buffer is completely carried out by normally programming said data into the cell upon which data programming is performed among each cell of said selected cell row, whereby data programming of one page length can be optimized with only a one-time external data input operation and without over-programming.

6. A non-volatile semiconductor memory device comprising:

a memory cell array arranged as a matrix having NAND-structured cells formed by a plurality of serially connected memory cells each of which is formed by stacking a charge storage layer and a control gate on a semiconductor substrate, and capable of electrically erasing by the mutual exchange of a charge between said charge storage layer and said substrate;

data latch means for endowing program data to bit lines of said memory cell array;

high voltage supply means for supplying a predetermined high voltage to said bit lines of said memory cell array in accordance with the status of the data of said data latch means;

current source means for supplying verifying current to said bit lines of said memory cell array in order to confirm the programmed status of data, after programming said data into said memory cell array; and program checking means for inverting the status of data of said data latch means in response to whether or not said verifying current applied to said bit lines flows through said programmed memory cell when said verifying voltage is supplied to said control gate of said memory cell which is to be verified in said memory cell array.

* * * * *